United States Patent [19]
Flesner et al.

[11] Patent Number: 5,248,931
[45] Date of Patent: Sep. 28, 1993

[54] LASER ENERGIZED HIGH VOLTAGE DIRECT CURRENT POWER SUPPLY

[75] Inventors: Larry D. Flesner, San Diego; Wadad B. Dubbelday, Spring Valley, both of Calif.

[73] Assignee: The United States of America as represented by the Secretary of the Navy, Washington, D.C.

[21] Appl. No.: 745,045

[22] Filed: Jul. 31, 1991

[51] Int. Cl.$^5$ .............................................. H02N 6/00
[52] U.S. Cl. ..................................... 322/2 R; 323/906
[58] Field of Search .................. 320/2; 322/2 R, 2 A; 323/906; 368/205; 250/214 R, 213 R; 136/291, 292, 293

[56] References Cited

U.S. PATENT DOCUMENTS

| | | | |
|---|---|---|---|
| 3,748,492 | 7/1973 | Baker | 307/117 |
| 4,349,775 | 9/1982 | Kwon et al. | 320/35 |
| 4,384,259 | 5/1983 | Capewell | 330/10 |
| 4,468,569 | 9/1984 | Norris | 290/1 R |
| 4,692,683 | 9/1987 | Lalmond | 322/2 R |
| 4,728,878 | 3/1988 | Anthony | 322/2 R |
| 4,730,115 | 3/1988 | Abe | 136/291 X |
| 4,777,387 | 10/1988 | Collins | 250/551 X |
| 5,043,590 | 8/1991 | Strandberg, Jr. et al. | 250/571 |
| 5,059,787 | 10/1991 | Lou | 250/211 J |

Primary Examiner—Kristine L. Peckman
Attorney, Agent, or Firm—Harvey Fendelman; Thomas G. Keough; Michael A. Kagan

[57] ABSTRACT

A light energized high voltage direct current power supply comprises a light source including solid-state laser diodes powered by electrical current at a voltage level, $V_1$, for generating light; a photocell array positioned to receive the light and fabricated with silicon-on-sapphire for providing electrical power having an output voltage $V_2$, where $V_2 > V_1$, where the photocell array includes serially connected photovoltaic cells; and a voltage regulator operably coupled to the light source and the photocell array for controlling the output of the power supply to a predetermined voltage level.

11 Claims, 10 Drawing Sheets

LASER ENERGIZED HIGH VOLTAGE DIRECT CURRENT POWER SUPPLY

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to direct current (DC) power supplies, and more particularly to a DC power supply which uses the output of solid state laser diodes coupled into high voltage arrays of photocells to convert low voltage DC power to high voltage DC power.

A widely used method for producing high voltage DC power is to convert the power from a low voltage power DC source to high voltage by a device known as an inverter. With this type of device, low voltage DC power is converted to alternating current (AC) power by an oscillator circuit and then is transformed to high voltage AC power by a transformer. The AC power is converted to DC power by a rectifier and filtering circuit.

A disadvantage with inverters is that the AC circuitry can radiate unwanted electromagnetic radiation which can interfere with other circuits if not properly shielded. However, such shielding adds weight and expense to high voltage supplies. The weight and volume of the transformer and electromagnetic shielding are disadvantageous for applications where minimum weight and volume are desired such as in aircraft or satellites. Thus, there is a need for a high voltage power supply which can be made very light and compact, and which does not produce electromagnetic interference.

SUMMARY OF THE PRESENT INVENTION

A light energized high voltage direct current power supply comprises a light source including solid-state laser diodes powered by electrical current at a voltage level, $V_1$, for generating light; a photocell array positioned to receive the light and fabricated with silicon-on-sapphire for providing electrical power having an output voltage $V_2$, where $V_2 > V_1$, where the photocell array includes serially connected photovoltaic cells; and a voltage regulator operably coupled to the light source and the photocell array for controlling the output of the power supply to a predetermined voltage level. In a second embodiment of the present invention, light is propagated from the light source through a solid transparent medium bonded to the sapphire. The light is conveyed from the medium through the sapphire so that the photocells fabricated on the sapphire substrate are illuminated without shadows.

The primary advantage of the present invention is that it provides a high voltage DC power supply without the need for an oscillator circuit and a transformer. The invention reduces electromagnetic interference and weight problems typically associated with high voltage DC power supplies. Furthermore, the invention does not require magnetic materials. Other advantages of the present invention will become apparent in light of the appended teachings.

DESCRIPTION OF THE PREFERRED EMBODIMENT

Figure 1:
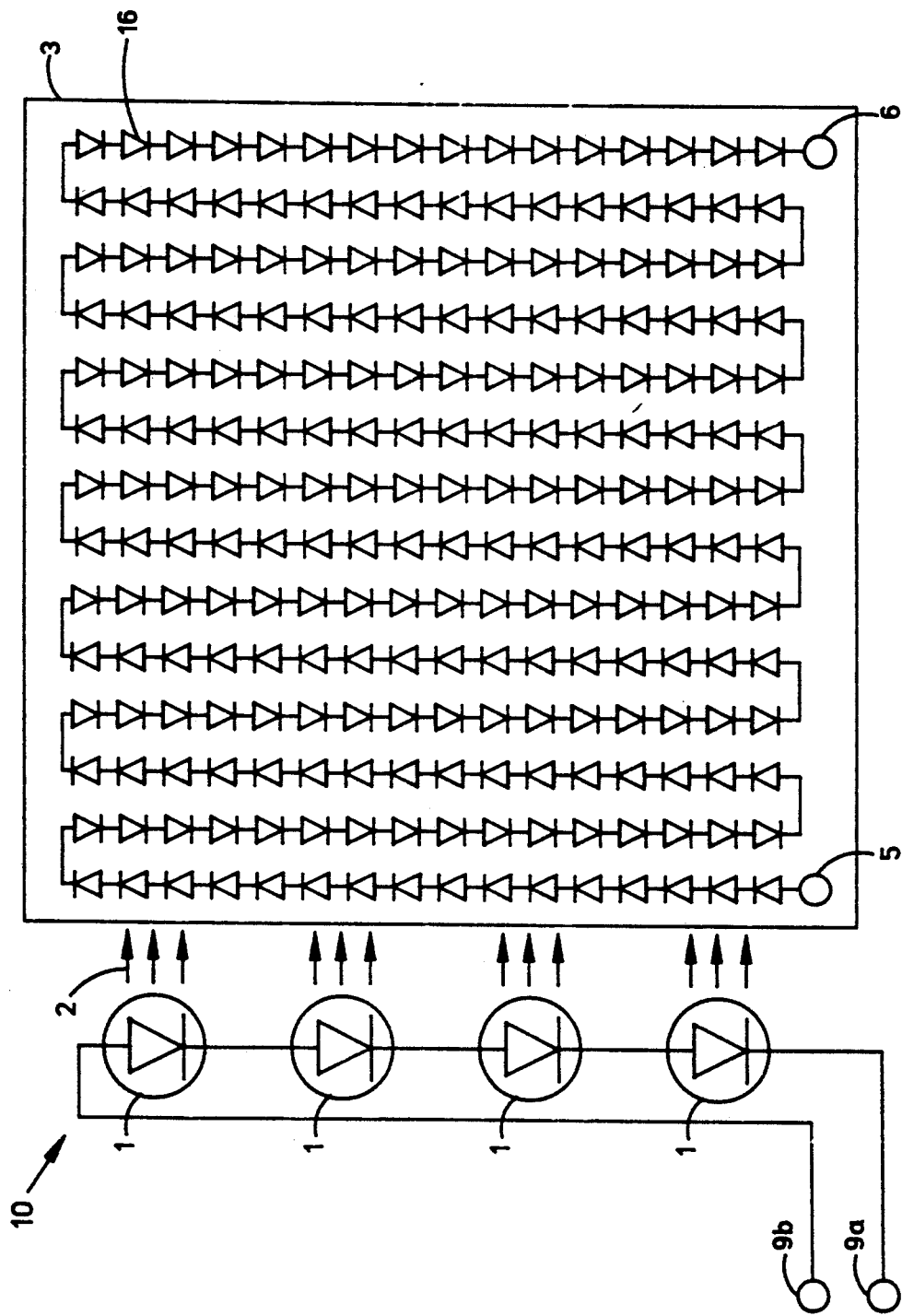
FIG. 1 is a schematic diagram of one embodiment of the present invention.

One embodiment of the present invention is described below with reference to FIG. 1 showing laser energized high voltage direct current power supply 10 which transforms low voltage DC power to high voltage DC power. Low voltage power, provided through input terminals 9a and 9b, energizes laser diodes 1 which direct light energy 2 onto photocell array 3 comprised of many photocells 16 connected in series. Photocells 16 each convert light energy 2 into a DC electrical voltage. The high voltage DC output available across contacts 5 and 6 is the algebraic sum of the voltage outputs of the individual photocells 16.

Photocell array 3 comprises individual photocells 16 connected in series. Such an array may consist of thousands of photocells such as p-n junction photovoltaic cells fabricated on an insulating substrate such as sapphire wafer 19 (Referring to FIG. 6, et seq.) by well known methods of electronic circuit micro-fabrication. In the preferred embodiment, photocell array 3 may be fabricated as described further herein.

Figure 2:
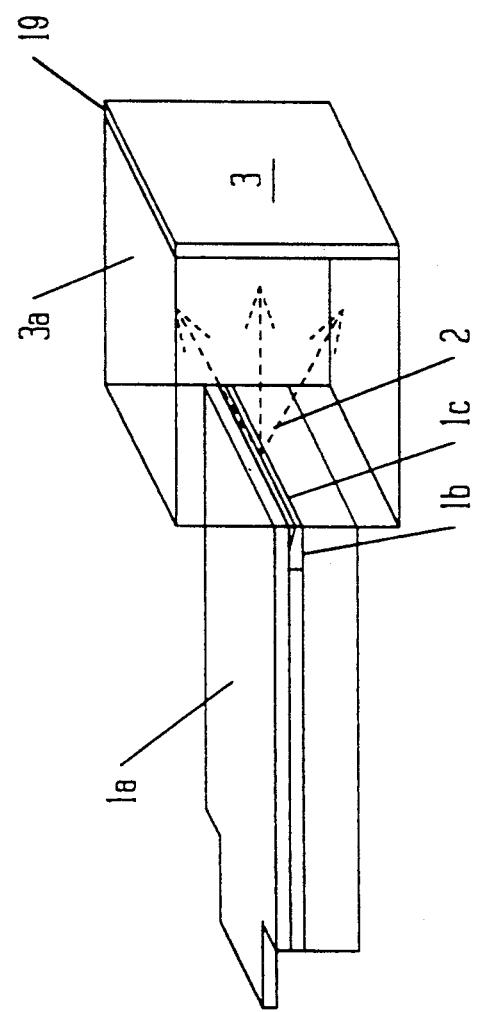
FIG. 2 is a diagram of a method for illuminating a photocell array with a linear laser diode array.

Light 2 from laser diodes 1 is directed onto photocell array 3, as for example, by positioning laser diodes so that the emitted light beams 2 are directed onto photocells 16 after passing through transparent sapphire substrate 19. This configuration advantageously avoids shadowing photocells 16 by layers on the top surface of photocell array 3. An example of this technique is described below with reference to FIG. 2 where there is shown laser source 1a positioned so that light 2 is emitted from surfaces 1c into solid transparent medium 3a and through sapphire substrate 19 in order to illuminate photocell array 3. Medium 3a may be, for example, a prism made of glass or quartz. Laser source 1a may comprise linear array 1b of laser diodes with a linear array of emitting surfaces 1c. Sapphire substrate 19 may be attached to solid transparent medium 3a by well known methods such as adhesive bonding using transparent adhesive, not shown. Bonding sapphire substrate 19 to solid transparent medium 3a allows solid transparent medium 3a to conduct heat away from photocell array 3. The heat is generated by absorbed light which is not converted into electrical energy. A sapphire substrate is particularly useful for heat dissipation because of the high thermal conductivity of sapphire. One example of a suitable laser source 1a is Model LCW-5105, manufactured by Laser Diode, Inc.

Alternative methods for illuminating photocell array 3 include using single laser diodes or two dimensional diode arrays in conjunction with suitable optical elements such as lenses, prisms, and mirrors to direct the light from the laser diodes onto the photocells.

Figure 3:
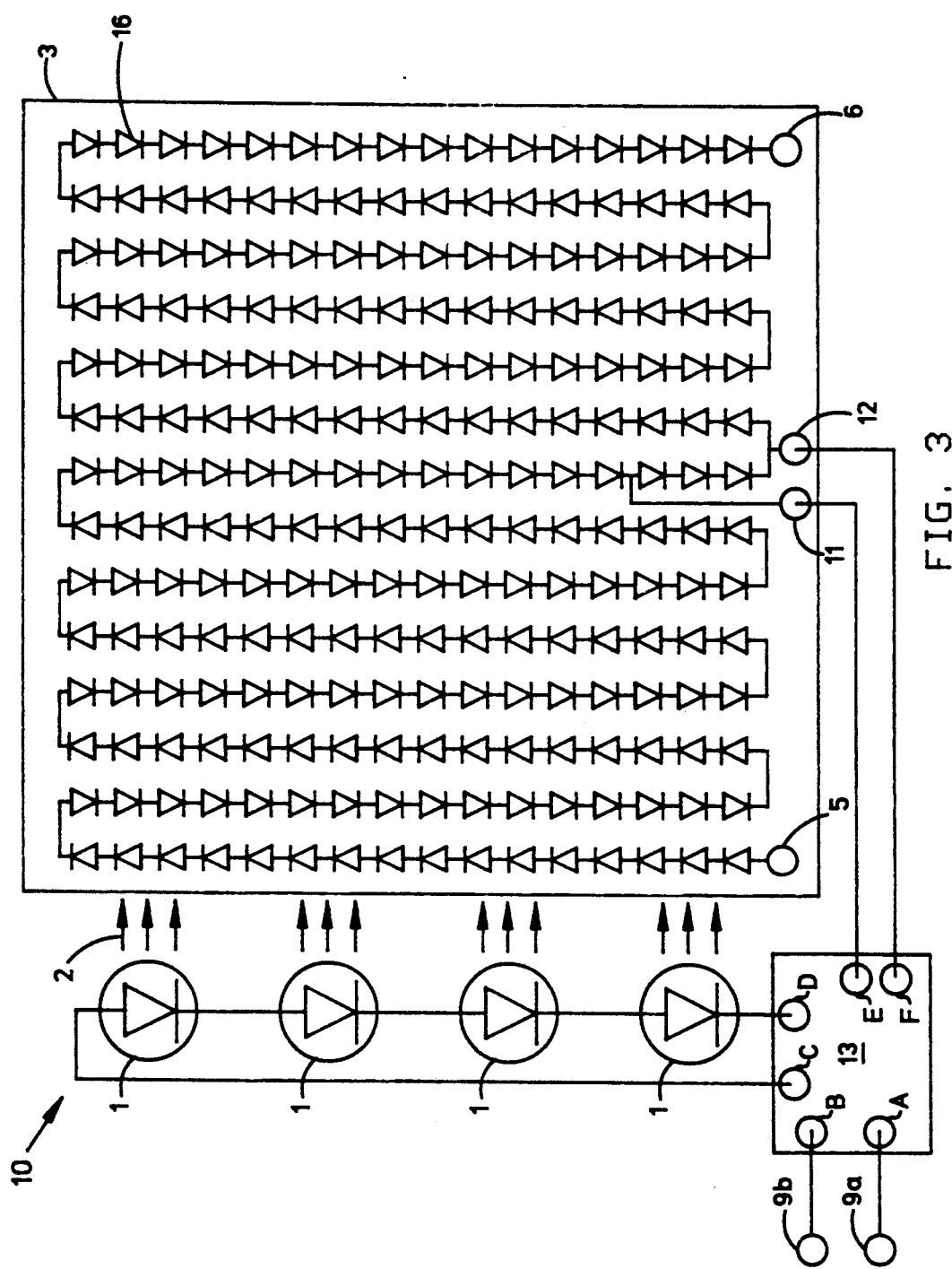
FIG. 3 is a schematic diagram of a second embodiment of the present invention.

In order to prevent energy waste and to control the high voltage output of photocell array 3, feedback control may be employed with power supply 10 as shown in FIG. 3 and described as follows: Low voltage DC power is input into terminals A and B of control circuit 13. Contacts 11 and 12, located on photocell array 3, provide feedback voltages to contacts E and F of control circuit 13. Typically, contact 12 would be a "center tap" to photocell array 3, i.e., it would be connected to the center of the series circuit of photocells 16. Contact 11 is connected at a circuit point suitably selected somewhere between serially connected photocells 16 that is separated by several photocells separated from contact 12. In this way a low voltage difference is produced between contacts 11 and 12 which is proportional to the high voltage output available across contacts 5 and 6. Control circuit 13 compares the feedback voltage to a selected reference voltage and suitably controls the power provided to laser diodes 1 through terminals C and D. In this way, a desired output voltage across terminals 5 and 6 can be maintained; and energy is provided to photocell array 3 only as needed to maintain the desired output voltage.

Figure 4:
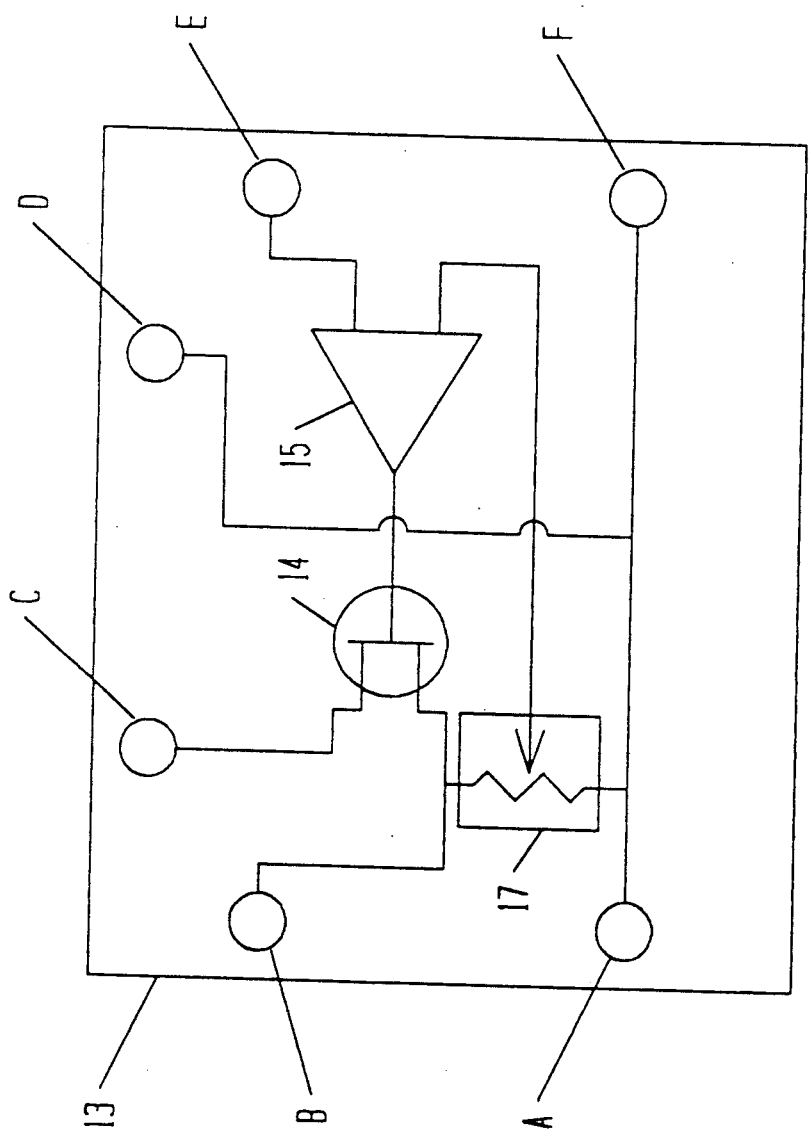
FIG 4 is a schematic diagram of a control circuit for controlling the power output from the photocell array.

An embodiment of a control circuit suitable for use in the present invention is described below with reference to FIG. 4. Differential amplifier 15 produces an output signal which is proportional to the difference between the feedback voltages, available at terminals E and F, and a reference voltage derived from variable resistor 17. The output of amplifier 15 controls power transistor 14, which may be a power CMOS transistor, to control the power directed to laser diodes I through terminals C and D. Low voltage DC input power is connected to terminals A and B. Control circuit 13, as illustrated in FIG. 4 and described above, is presented by way of example only. It is to be understood that control circuit 13 may be implemented in many different ways, as would be well known to those skilled in the art of electrical circuit design.

Figure 5:
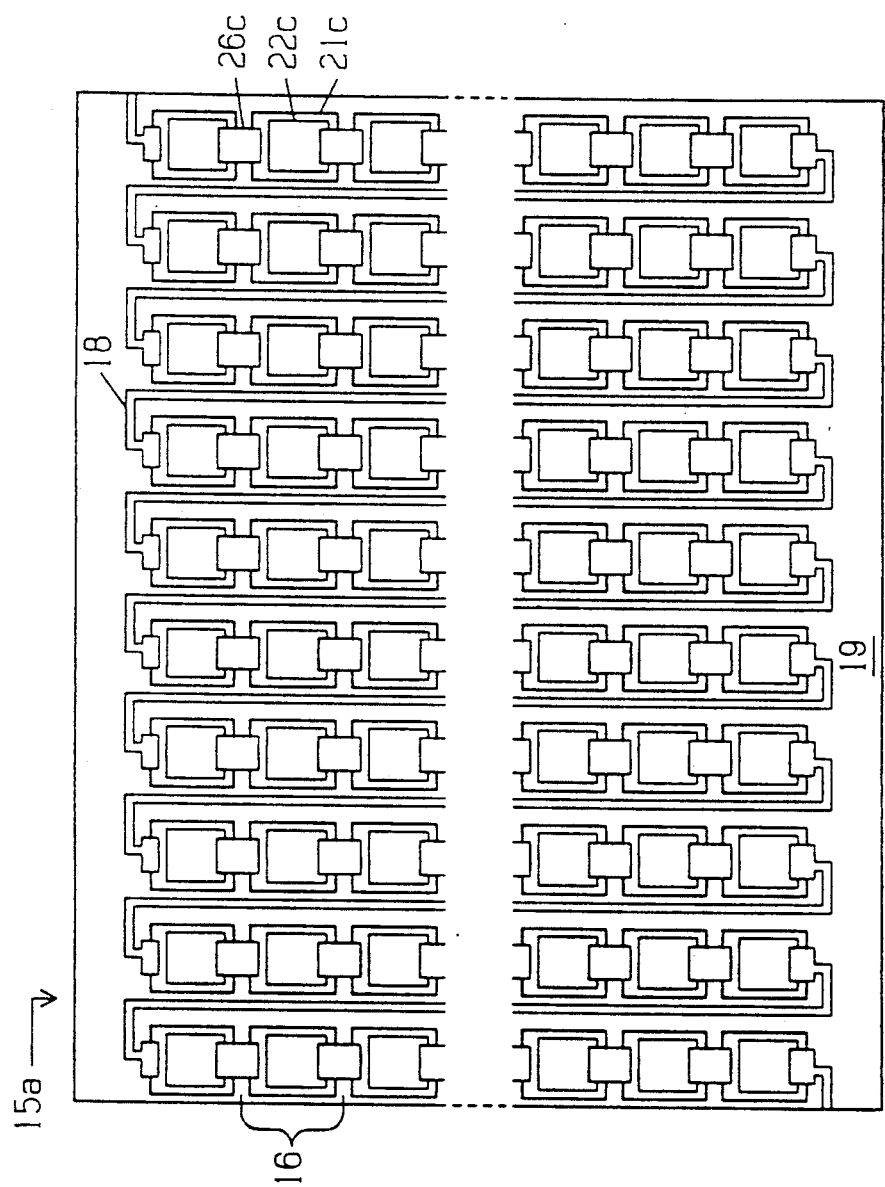
FIG. 5 is a top view of the photocell array.

Referring to FIG. 5, photocell array 3 includes arrays of individual photocells 16 connected in series by interconnecting lines 18 and 26c. Elements of photocell array 3 include sapphire substrate 19, silicon islands 21c, contact junctions 22c, and interconnecting lines 26c and 18. Typical dimensions of silicon islands 21c may be 100 micrometers by 100 micrometers. There may be any number of photocells 16 in photocell array 3. For example, a suitable array may consist of 4000 photocells. Such an array may occupy an area of 1 cm$^2$ and produce a maximum output of about 2000 volts when illuminated with laser diodes of the type described above. If the optical power intensity is 1 watt/cm$^2$, then the available current will be about 40 microamperes.

Figure 6:
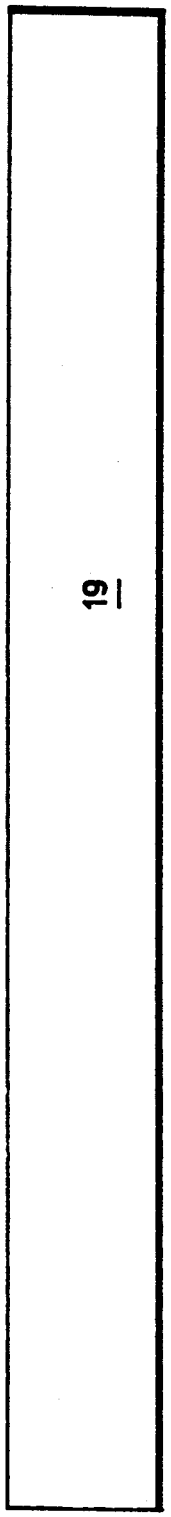
FIGS. 6-18 show the various steps in fabrication of the photocell array.
Figure 7:
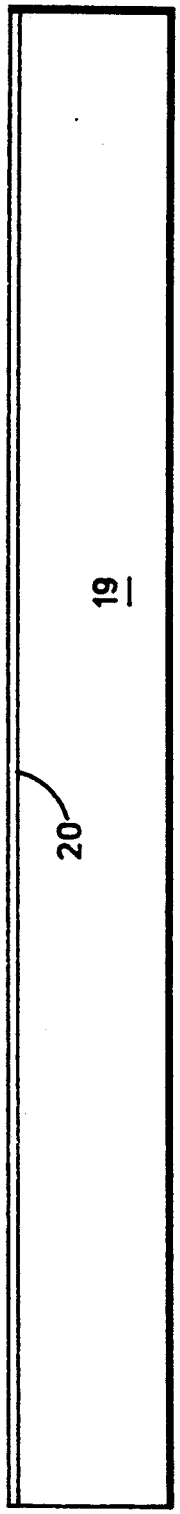
Figure 8:
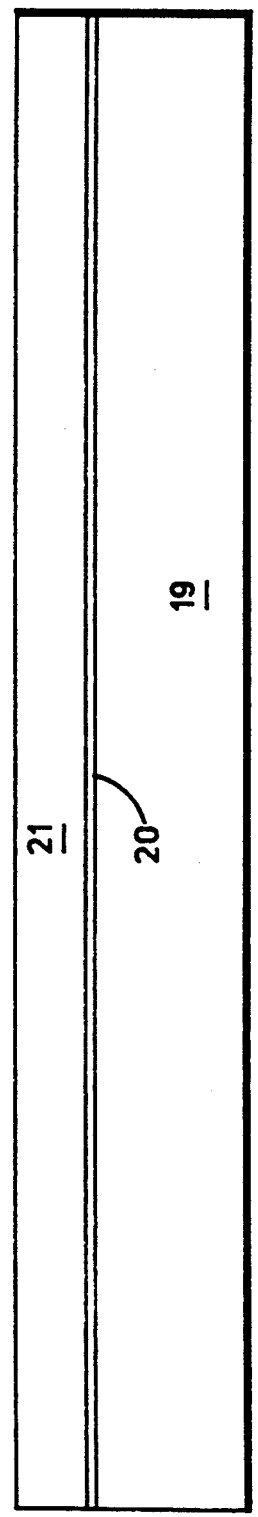

A method for fabricating photocell array 3 is described as follows with reference to FIG. 6: Beginning with sapphire substrate 19, a thin layer of silicon 20 is epitaxially deposited on to substrate 19 by well known methods (FIG. 7). Silicon layer 20 may have a thickness in the range of 1000 to 5000 angstroms, with a typical value of 3000 angstroms. Silicon layer 20 is made amorphous by bombardment with high energy silicon ions, then recrystallized by thermal annealing. This step is done to achieve the desired electrical properties of the silicon epitaxial layers. Layer 20 is then ion implanted with a p-type dopant such as boron to a doping level in the range of $10^{18}$ cm$^{-3}$. Referring to FIG. 8, lightly doped p-type silicon layer 21 is epitaxially grown on top of silicon layer 20. The doping level of p-type silicon layer 21 may be in the range of $10^{15}$ to $10^{16}$ cm$^{-3}$. A typical dopant is boron, and the thickness of silicon layer 20 may be in the range of 1 to 10 micrometers.

Figure 9:
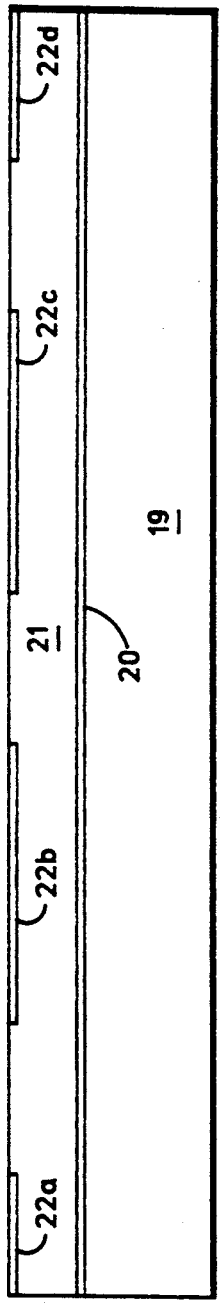

Referring to FIG. 9, top junction layers 22a-22d are formed by ion-implantation of an n-type dopant such as phosphorous to a doping level in the range of $10^{16}$ to $10^{18}$ cm$^{-3}$ into p-type silicon layer 21. Top junctions layers 22a to 22d are implanted in selected regions of p-type silicon layer 21 by the well know method of selective ion-implantion. Briefly, this consists of using optically patterned photoresist to form an implantion mask. The photoresist is removed after ion-implantation.

Figure 10:
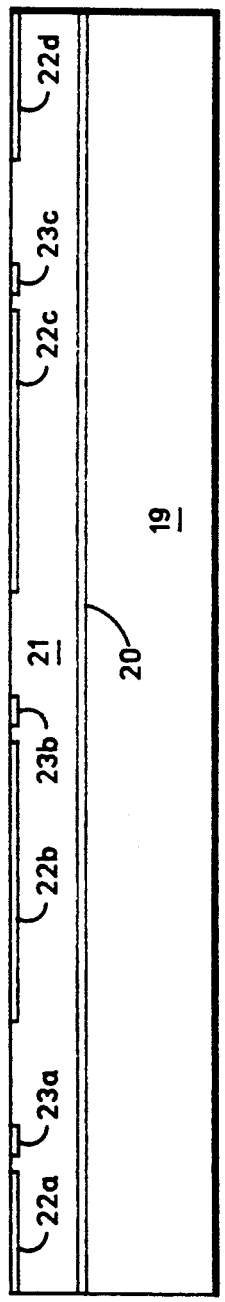

Next, referring to FIG. 10, highly doped p-type regions 23a-23c for making electrical contact to lightly doped p-type layer 21 are formed by selective ion-implantion. The doping level of regions 23a-23d may be in the range of $10^{18}$ cm$^{-3}$. Electrical activation of the ion-implanted regions of p-type silicon layer 21 is accomplished by the well known method of thermal annealing. Prior to thermal annealing, a protective layer of silicon dioxide, not shown, is deposited over substrate 19. The protective layer may then be removed.

Figure 11:
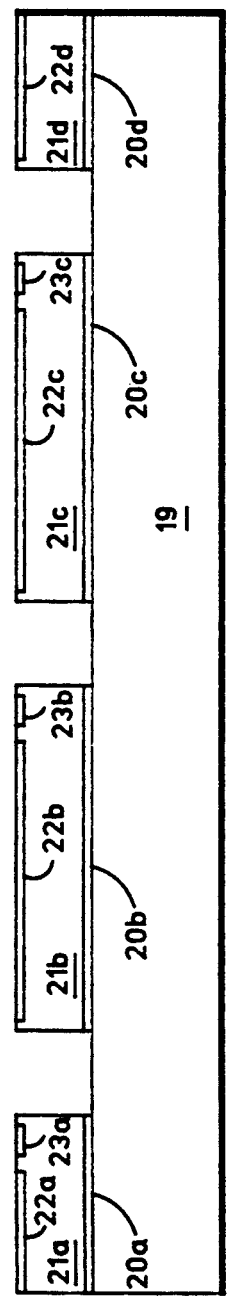

As shown in FIG. 11, silicon layers 20 and 21 are next selectively etched using well known plasma etching techniques to form isolated islands, or mesas 21a, 21b, 21c, and 21d of silicon on sapphire substrate 19. The selective etching process is well known. It includes steps in which a photoresist mask is deposited and optically patterned.

Figure 12:
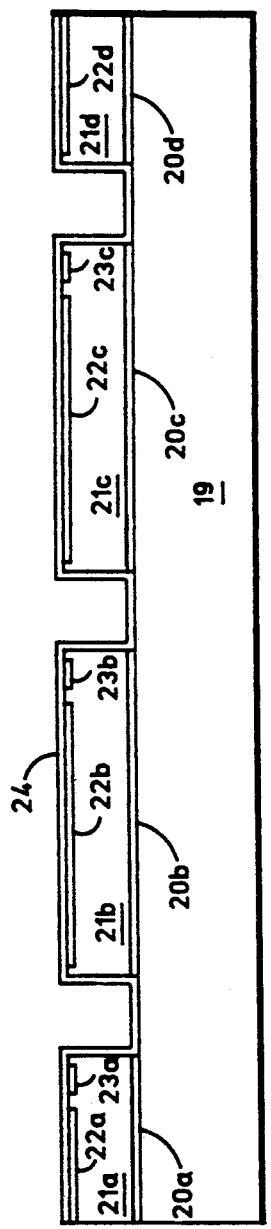
Figure 13:
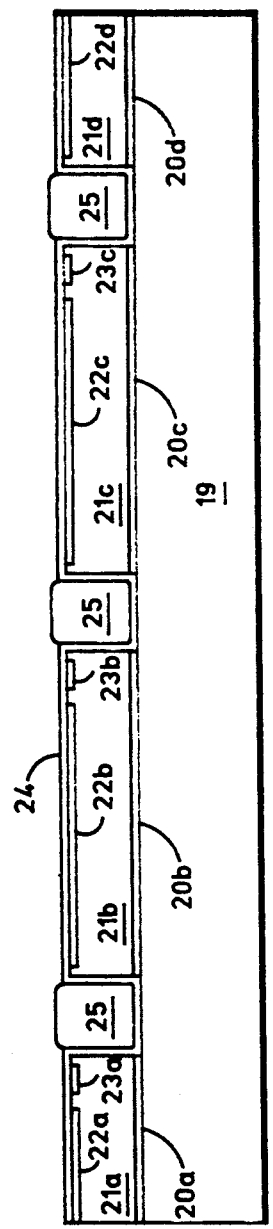

Protective silicon oxide layer 24 is deposited over silicon mesas 21a—21d and sapphire substrate 19 as shown in FIG. 12. Referring to FIG. 13, planarizing layer 25 then is deposited and patterned as shown in FIG. 12 between mesas 21a-21d. This step may be performed by depositing a layer of photosensitive polyimide which is optically patterned to obtain the result illustrated. Planarization reduces the problem of step coverage when forming interconnection layers between the silicon mesas 21a-21d.

Figure 14:
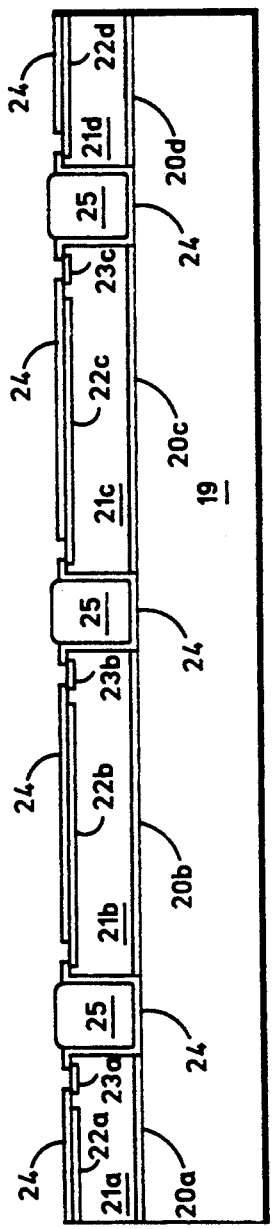

Contact holes are selectively etched in protective oxide 24 as shown in FIG. 14. As with selective ion-implantation and selective etching of the silicon mesas, selective etching of holes in silicon oxide layers is well known.

Figure 15:
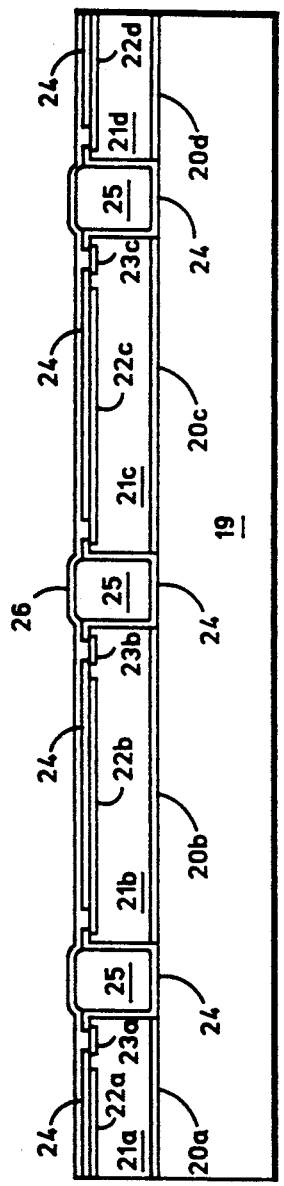
Figure 16:
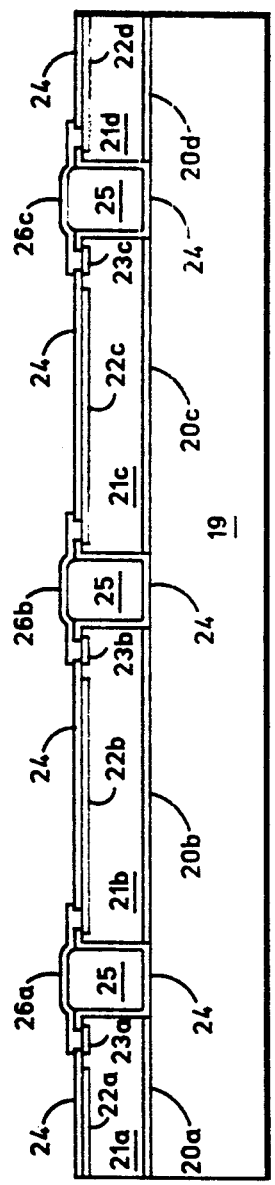

Metal layer 26 such as aluminum is deposited as shown in FIG. 15. Metal layer 26 is selectively patterned to form electrical connection from regions 23a to 22b, 23b to 22c, etc. as shown in FIG. 16.

Figure 17:
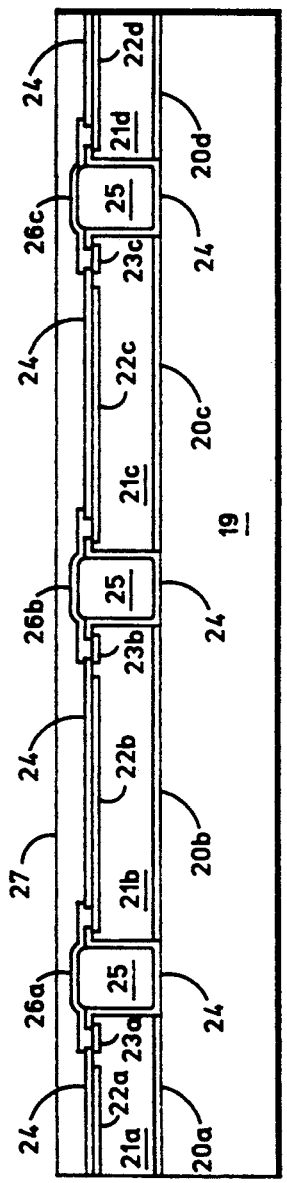

Referring to FIG. 17, protective silicon oxide layer 27 is formed over the entire substrate 19. Holes, not shown, provided in protective oxide layer 27 are formed over large metal areas for the purpose of providing contact areas for contacts 5 and 6 shown in FIGS. 1 and 3.

Figure 18:
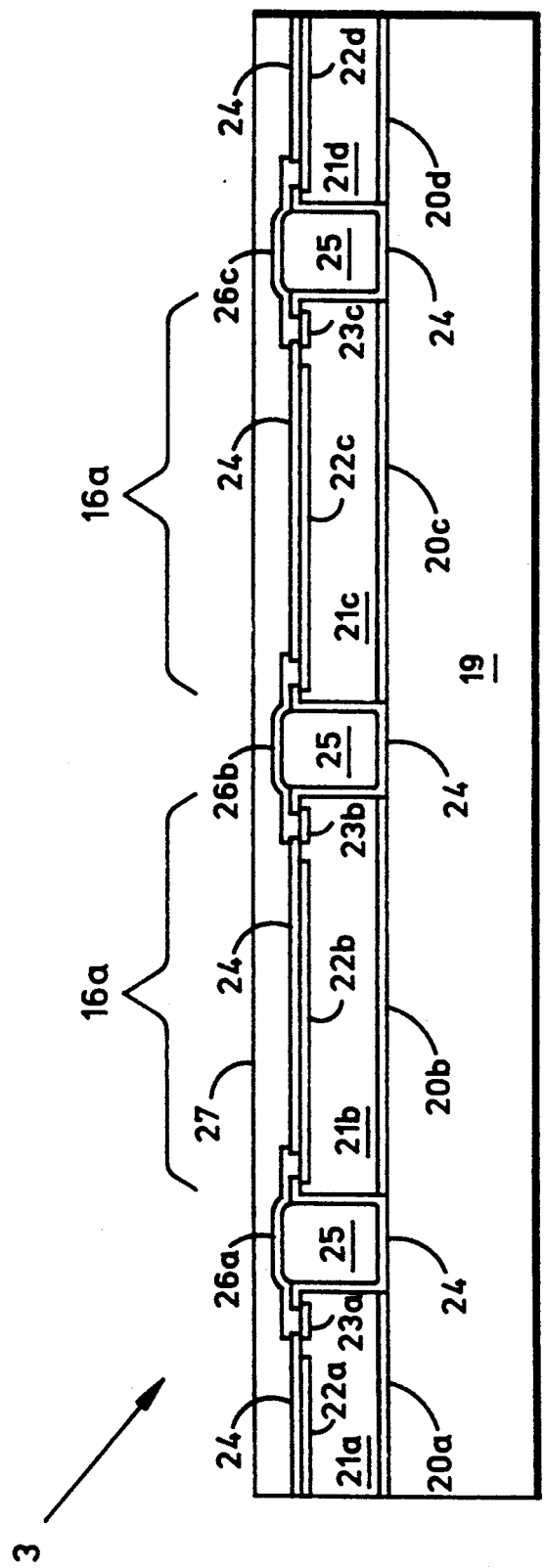

Photocell array 3, shown in cross-section in FIG. 18, includes sapphire substrate 19, heavily p-type layers 20a-20d, lightly p-type layers 21a-21d, n-type layers 22a-22d, heavily p-type layers 23a-23d, protective silicon oxide layer 24, planarizing layer 25, metal interconnection layers 26a-26d, and protective silicon oxide layer 27. Photocell mesa 16a may include, for example, the patterned silicon region with layers 20b, 21b, 22b, and 23b. Photocell mesa 16b is connected to photocell mesa 16a by metal layer 26b. Arrays of photocell mesas with up to thousands of photocells 16 are fabricated as illustrated, by way of example, in FIG. 5.

The photocell array fabricated with the above-referenced techniques is particularly well suited for employment in the present invention because it provides very high voltage with optimized efficiency. When exicted by optical power, an individual photocell mesa produces up to approximately 0.5 V of electrical potential. A photocell with lateral dimensions of 100 by 100 micrometers is expected to produce an output electrical current up to approximately 40 microamperes when illuminated by 1 watt cm$^{-2}$ of optical power with a wavelength of about 0.8 micrometers. An alternative method of manufacturing photocell array 3 would be to follow the fabrication steps outlined above, but to substitute n-type doping in the layers which are specified as p-type, and p-type doping in the layers which are specified as n-type. The polarity of the electrical output will be reversed, but comparable performance would otherwise be expected.

Obviously, many modifications and variations of the present invention are possible in light of the above teachings. It is therefore to be understood that within the scope of the appended claims, the invention may be practiced otherwise than as specifically described.

We claim:

1. A light energized high voltage direct current power supply, comprising:
   a light source including solid-state laser diodes powered by electrical current at a voltage level, $V_1$, for generating light;
   a photocell array positioned to receive said light and fabricated with silicon-on-sapphire for providing electrical power having an output voltage $V_2$, where $V_2 > V_1$, said photocell array including multiple, serially connected photovoltaic cells; and
   means operably coupled to said light source and said photocell array for controlling the output of said power supply to a predetermined voltage level.

2. The power supply of claim 1 wherein said controlling means includes:
   a differential amplifier operably coupled to receive a feedback voltage signal from said photocell array and a reference voltage signal, and to provide an output signal having a voltage which is proportional to a voltage difference between said feedback voltage signal and said reference voltage signal; and
   a power transistor operably coupled to provide a control output signal to said light source that controls the intensity of said light generated by said light source in response to receiving said output signal from said amplifier.

3. A light energized high voltage direct current power supply, comprising:
   a light source powered by electrical current at a voltage level, $V_1$, for generating light; a photocell array fabricated with silicon and sapphire forming a silicon-on-sapphire structure and positioned to receive said light through said sapphire for providing electrical power having an output voltage $V_2$, where $V_2 > V_1$, said photocell array including multiple, serially connected photovoltaic cells;
   a solid, transparent medium having a surface bonded to said sapphire and positioned to receive said light from said light source and convey said light to said sapphire.

4. The power supply of claim 3 wherein:
   and light source includes solid-state laser diodes.

5. The power supply of claim 3 further including:
   means operably coupled to said light source and said photocell array for controlling the output of said power supply to a predetermined voltage level.

6. The power supply of claim 5 wherein said controlling means includes:
   a differential amplifier operably coupled to receive a feedback voltage signal from said photocell array and a reference voltage signal, and to provide an output signal having a voltage which is proportional to a voltage difference between said feedback voltage signal and said reference voltage signal; and
   a power transistor operably coupled to provide a control output signal to said light source that controls the intensity of said light generated by said light source in response to receiving said output signal from said amplifier.

7. The power supply of claim 6 wherein:
   said light source includes solid-state laser diodes.

8. A light energized high voltage direct current power supply, comprising:
   a light source powered by electrical current at a voltage level, $V_1$, for generating light; and
   a photocell array positioned to receive said light and fabricated with silicon-on-sapphire formed of silicon bonded to sapphire for providing electrical power having an output voltage $V_2$, where $V_2 > V_1$, said photocell array including multiple, serially connected photovoltaic cells.

9. A light energized high voltage direct current power supply, comprising:
   a light source powered by electrical current at a voltage level, $V_1$, for generating light; and
   a photocell array fabricated with silicon-on-sapphire formed of silicon bonded to sapphire and positioned to receive said light through said sapphire for providing electrical power having an output voltage $V_2$, where $V_2 > V_1$, said photocell array including multiple, serially connected photovoltaic cells.

10. A light energized high voltage direct current power supply, comprising:
    a light source powered by electrical current at a voltage level, $V_1$, for generating light;
    a photocell array positioned to receive said light and fabricated with silicon-on-sapphire for providing electrical power having an output voltage $V_2$, where $V_2 > V_1$, said photocell array including multiple serially connected photovoltaic cells, said photocell array fabricated by forming multiple electrically isolated photovoltaic cells on a sapphire substrate and then electrically interconnecting said photovoltaic cells in series: and
    means operably coupled to said light source and said photocell array for controlling the output of said power supply to a predetermined voltage level.

11. The power supply of claim 10 wherein said controlling means includes:
    a differential amplifier operably coupled to receive a feedback voltage signal from said photocell array and a reference voltage signal, and to provide an output signal having a voltage which is proportional to a voltage difference between said feedback voltage signal and said reference voltage signal; and
    a power transistor operably coupled to provide a control output signal to said light source that controls the intensity of said light generated by said light source in response to receiving said output signal from said amplifier.

* * * * *